United States Patent
Kim

(10) Patent No.: US 10,614,863 B2
(45) Date of Patent: Apr. 7, 2020

(54) NONVOLATILE MEMORY DEVICE, OPERATING METHOD THEREOF, AND DATA STORAGE APPARATUS INCLUDING THE SAME

(71) Applicant: SK hynix Inc., Gyeonggi-do (KR)

(72) Inventor: Do Hyun Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 15 days.

(21) Appl. No.: 15/960,742

(22) Filed: Apr. 24, 2018

(65) Prior Publication Data
US 2019/0096449 A1    Mar. 28, 2019

(30) Foreign Application Priority Data

Sep. 26, 2017   (KR) .......................... 10-2017-0124297

(51) Int. Cl.
  *G11C 7/10*    (2006.01)
  *H03K 19/21*   (2006.01)
  *G11C 29/04*   (2006.01)

(52) U.S. Cl.
  CPC ............ *G11C 7/1057* (2013.01); *G11C 7/106* (2013.01); *G11C 7/1084* (2013.01); *G11C 7/1087* (2013.01); *G11C 2029/0411* (2013.01); *H03K 19/21* (2013.01)

(58) Field of Classification Search
  CPC ..... G11C 7/1057; G11C 7/106; G11C 7/1084; G11C 7/1087; G11C 2029/0411; H03K 19/21
  USPC ...................................... 365/189.05
  See application file for complete search history.

(56) References Cited

U.S. PATENT DOCUMENTS

| | | | |
|---|---|---|---|
| 2016/0011779 A1* | 1/2016 | Lee .......................... | G06F 3/061 711/103 |
| 2017/0242586 A1* | 8/2017 | Jung ....................... | G06F 3/061 |

FOREIGN PATENT DOCUMENTS

KR     1020120110672     10/2012

* cited by examiner

*Primary Examiner* — Huan Hoang
*Assistant Examiner* — Minh Dinh
(74) *Attorney, Agent, or Firm* — IP & T Group LLP

(57) ABSTRACT

A nonvolatile memory device includes a memory cell array, a page buffer including a first latch configured to store data to be programmed in a first state, a second latch configured to store the data in a second state, and a third latch configured to store the data in a third state when the data is received from an external apparatus, and a control logic configured to control the page buffer to store the data of the first state in the first latch, the data of the second state in the second latch, and the data of the third state in the third latch when a multi-conversion program command and the data are received from the external apparatus.

17 Claims, 10 Drawing Sheets

NONVOLATILE MEMORY DEVICE, OPERATING METHOD THEREOF, AND DATA STORAGE APPARATUS INCLUDING THE SAME

CROSS-REFERENCES TO RELATED APPLICATION

The present application claims priority under 35 U.S.C. § 119(a) to Korean patent application number 10-2017-0124297, filed on Sep. 26, 2017, which is incorporated herein by reference in its entirety.

BACKGROUND

1. Technical Field

Various embodiments of the present disclosure generally relate to a semiconductor apparatus. Particularly, the embodiments relate to a nonvolatile memory device, an operating method thereof, and a data storage apparatus including the same.

2. Related Art

The computer environment paradigm has recently been transitioning to ubiquitous computing, which enables computer systems to be used anytime and anywhere. As a result, use of portable electronic apparatuses such as a mobile phone, a digital camera, and a laptop computer has been increasing rapidly. Generally, portable electronic apparatuses use data storage apparatuses that employ memory devices. Data storage apparatuses may be used to store data used in the portable electronic apparatuses.

Data storage apparatuses using memory devices provide excellent stability, durability, high information access speed, and low power consumption since they have no mechanical driving units. Examples of such data storage apparatuses may include a universal serial bus (USB) memory device, a memory card having various interfaces, a universal flash storage (UFS) device, a solid state drive (SSD), and the like.

SUMMARY

Embodiments are provided to a nonvolatile memory device with improved data reliability, an operating method thereof, and a data storage apparatus including the same.

In an embodiment of the present disclosure, a nonvolatile memory device may include: a memory cell array; a page buffer including a first latch configured to store data to be programmed in a first state, a second latch configured to store the data in a second state, and a third latch configured to store the data in a third state when the data is received from an external apparatus; and a control logic configured to control the page buffer to store the data of the first state in the first latch, the data of the second state in the second latch, and the data of the third state in the third latch when a multi-conversion program command and the data are received from the external apparatus.

In an embodiment of the present disclosure, an operating method of a nonvolatile memory device, the method may include: determining whether a multi-conversion program command is received from an external apparatus; storing data of a first state in a first latch, data of a second state in a second latch, and data of a third state in a third latch of a page buffer based on data to be programmed received with the multi-conversion program command when the multi-conversion program command is received; and storing the data of the first state, the data of the second state, and the data of the third state stored in the page buffer in pages of a memory cell corresponding to an address to be programmed.

In an embodiment of the present disclosure, a data storage apparatus may include: a nonvolatile memory device; and a controller configured to control an operation of the nonvolatile memory device. The nonvolatile memory device may include: a memory cell array including a plurality of memory cells, each memory cell configured of a plurality of pages; a page buffer including a first latch configured to store data to be programmed in a first state, a second latch configured to store the data in a second state, and a third latch configured to store the data in a third state when the data is received from the controller; and a control logic configured to control the page buffer to store the data of the first state, the data of the second state, and the data of the third state in the first latch, the second latch, and the third latch when a multi-conversion program command and the data are received from the controller.

In an embodiment of the present disclosure, a memory system may include: a memory device; and a controller configured to control the memory device to perform a multi-conversion program operation and a single conversion read operation. The memory device converts an original single level data into a multi-level data to be programmed therein during the multi-conversion program operation, and converts the multi-level data read therefrom into the single level data during the single conversion read operation.

In an embodiment of the present disclosure, a memory device may include: a memory cell array; a page buffer; and a control logic configured to control the page buffer to convert an original single level data into a multi-level data to be programmed into the memory cell array during a multi-conversion program operation; and to convert the multi-level data read from the memory cell array into the single level data during a single conversion read operation.

These and other features, aspects, and embodiments are described below in the section entitled "DETAILED DESCRIPTION"

BRIEF DESCRIPTION OF THE DRAWINGS

The above and other aspects, features, and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

As used herein, singular forms may include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

Hereinafter, the various embodiments of the present invention will be described in detail with reference to the attached drawings.

Figure 1:
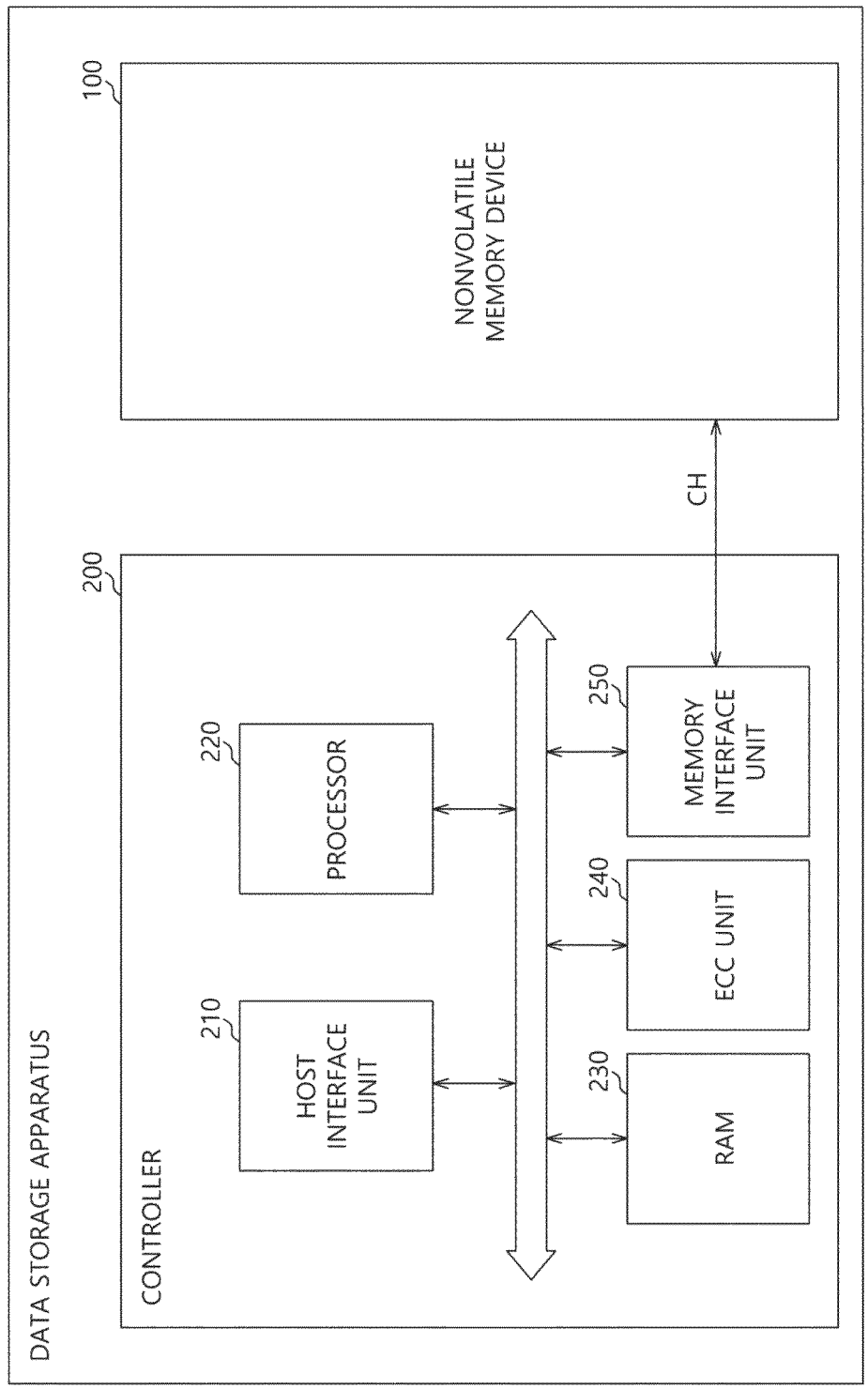
FIG. 1 is a block diagram illustrating a data storage apparatus according to an embodiment of the present disclosure.
Figure 2:
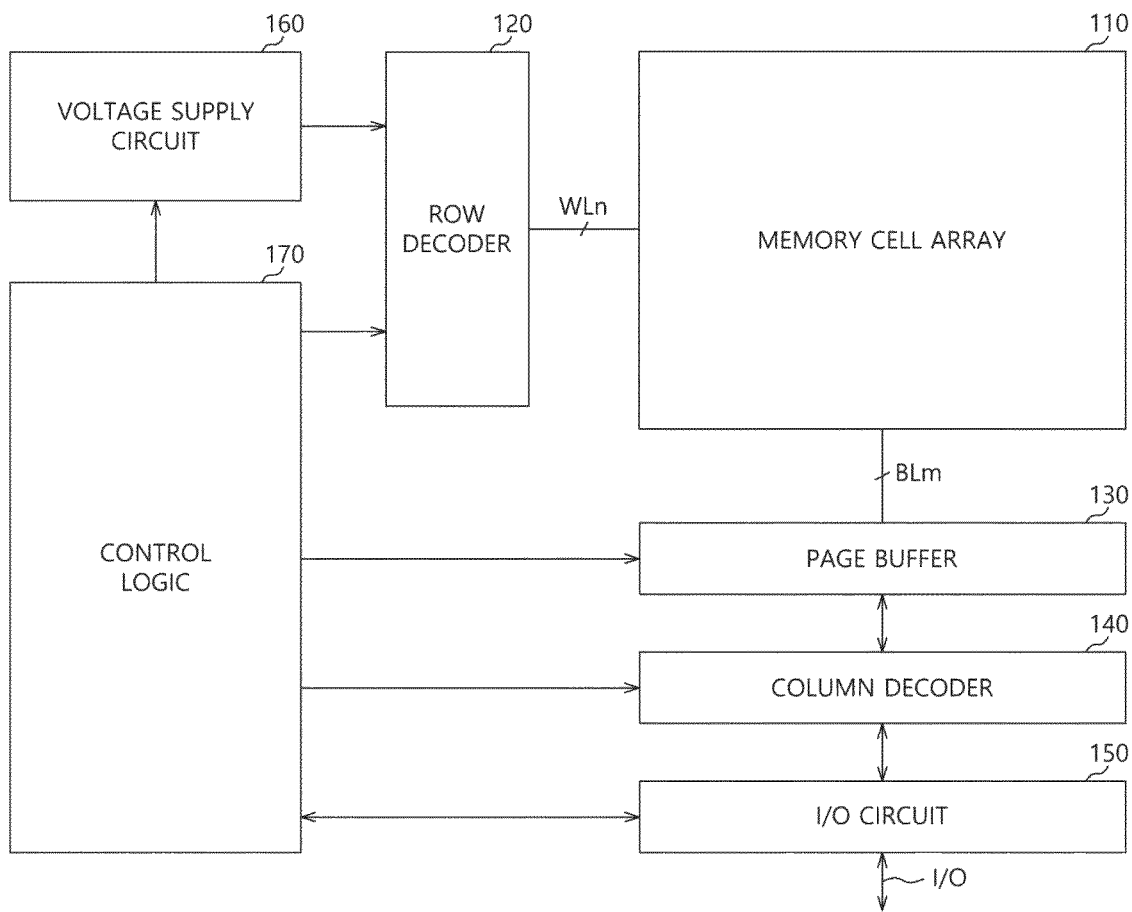
FIG. 2 is a block diagram illustrating a configuration example of a nonvolatile memory device of FIG. 1.

FIG. 1 is a block diagram illustrating a data storage apparatus 10 according to an embodiment. FIG. 2 is a block diagram illustrating a configuration example of a nonvolatile memory device 100 shown in FIG. 1.

Referring to FIG. 1, the data storage apparatus 10 according to an embodiment may store data to be accessed by a host apparatus (not shown) such as a mobile phone, an MP3 player, a laptop computer, a desktop computer, a game player, a television (TV), or an in-vehicle infotainment system, and the like. The data storage apparatus 10 may refer to a memory system.

The data storage apparatus 10 may be manufactured as any one among various types of storage apparatuses according to a protocol of an interface coupled to a host apparatus (not shown). For example, the data storage apparatus 10 may be configured of any one of various types of storage apparatuses, such as a solid state drive (SSD), a multimedia card in the form of an MMC, an eMMC, an RS-MMC, and a micro-MMC, a secure digital card in the form of an SD, a mini-SD, and a micro-SD, a universal serial bus (USB) storage device, a universal flash storage (UFS) device, a personal computer memory card international association (PCMCIA) card type storage device, a peripheral component interconnection (PCI) card type storage device, a PCI-express (PCI-E) card type storage device, a compact flash (CF) card, a smart media card, a memory stick, and the like.

The data storage apparatus 10 may be manufactured as any one among various types of packages. For example, the data storage apparatus 10 may be manufactured as any one of various types of packages, such as a package on package (POP), a system in package (SIP), a system on chip (SOC), a multi-chip package (MCP), a chip on board (COB), a wafer-level fabricated package (WFP), and a wafer-level stack package (WSP).

The data storage apparatus 10 may include a nonvolatile memory device 100 and a controller 200.

The controller 200 may control an overall operation of the data storage apparatus 10 through driving of firmware or software loaded into a random access memory (RAM) 230. The controller 200 may decode and drive a code-type instruction or algorithm such as the firmware or software. The controller 200 may be implemented in a hardware form or a combination form of hardware and software.

The controller 200 may include a host interface unit 210, a processor 220, the RAM 230, an error correction code (ECC) unit 240, and a memory interface unit 250.

The host interface unit 210 may perform interfacing between a host apparatus (not shown) and the data storage device 10 in response to a protocol of the host apparatus. For example, the host interface unit 210 may communicate with the host apparatus through any one among a USB protocol, a UFS protocol, an MMC protocol, a parallel advanced technology attachment (PATA) protocol, a serial advanced technology attachment (SATA) protocol, a small computer system interface (SCSI) protocol, a serial attached SCSI (SAS) protocol, a PCI protocol, and a PCI-E protocol.

The processor 220 may be configured of a micro control unit (MCU) and a central processing unit (CPU). The processor 220 may process a request transmitted from the host apparatus. To process the request transmitted from the host apparatus, the processor 220 may drive a code-type instruction or algorithm loaded into the RAM 230, for example, firmware and control internal function blocks, for example, the host interface unit 210, the RAM 230, the ECC unit 240, the memory interface unit 250, and the like and the nonvolatile memory device 100.

The processor 220 may generate control signals for controlling an operation of the nonvolatile memory device 100 based on requests transmitted from the host apparatus and provide the generated control signals to the memory interface unit 250.

For example, the processor 220 may generate the multi-conversion program command and the single conversion read command based on a request of a host apparatus and provide the generated multi-conversion program command and single conversion read command to the nonvolatile memory device 100 through the memory interface unit 250.

The RAM 230 may be configured of a random access memory such as a dynamic random access memory (DRAM) or a static random access memory (SRAM). The RAM 230 may store firmware driven through the processor 220. The RAM 230 may store data required for the driving of the firmware, for example, meta data. For example, the RAM 230 may operate as a working memory of the processor 220.

The RAM 230 may temporarily store program data to be transmitted to the nonvolatile memory device 100 from a host apparatus and read data to be transmitted to the host apparatus from the nonvolatile memory device 100. For example, the RAM 230 may operate as a buffer memory.

The ECC unit 240 may perform an ECC encoding operation in which parity data of data to be transmitted to the nonvolatile memory device 100 from a host apparatus may be generated. The ECC unit 240 may perform an ECC decoding operation which detects and corrects an error in data read out from the nonvolatile memory device 100 based on the parity data corresponding to the read data.

Although FIG. 1 shows that the data storage apparatus 10 includes only one nonvolatile memory device 100, the present embodiment is not limited thereto. That is, the data storage apparatus 10 may include a plurality of nonvolatile memory devices. The data storage apparatus 10 including one nonvolatile memory device in the embodiment may be equally applied to the data storage apparatus 10 including the plurality of nonvolatile memory devices.

Referring to FIG. 2, the nonvolatile memory device 100 may be used as a storage medium of the data storage apparatus 10. The nonvolatile memory device 100 may include any one of various types of nonvolatile memory devices, such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase-change random access memory (PRAM) using a chalcogenide alloy, and a resistive random access memory (RERAM) using a transition metal compound.

The nonvolatile memory device 100 may include a memory cell array 110, a row decoder 120, a page buffer 130, a column decoder 140, an input/output (I/O) circuit 150, a voltage supply circuit 160, and a control logic 170.

The memory cell array 110 may include a plurality of memory cells (not shown) arranged in regions in which a plurality of word lines WLn and a plurality of bit lines BLm cross each other. For example, each of the memory cells may be at least one among a single level cell (SLC) in which a single bit data (for example, 1-bit data) is stored, a multilevel cell (MLC) in which 2-bit data is stored, a triple level cell (TLC) in which 3-bit data is stored, and a quad level cell (QLC) in which 4-bit data is stored. The memory cell array 110 may include at least one or more cells among the SLC, the MLC, the TLC, and the QLC. For example, the memory cell array 110 may include memory cells having a two-dimensional (2D) horizontal structure or memory cells having a three-dimensional (3D) vertical or stacked structure.

The memory cell array 110 may include a plurality of planes and each of the planes may include a plurality of blocks. Each of the plurality of blocks may include a plurality of pages. Each of the plurality of pages may include a plurality of sectors.

The row decoder 120 may select any one of a plurality of word lines WLn coupled to the memory cell array 110. For example, the row decoder 120 may select the any one of the plurality of word lines WLn based on a row address received from the control logic 170 and provide a word line voltage provided from the voltage supply circuit 160 to the selected word line.

The page buffer 130 may be coupled to the memory cell array 110 through the plurality of bit lines BLm. The page buffer 130 may temporarily store pieces of program data to be programmed in the memory cell array 110 or pieces of read data read out from the memory cell array 110.

The column decoder 140 may select any one from among the plurality of bit lines BLm coupled to the memory cell array 110. For example, the column decoder 140 may select any one bit line from among the plurality of bit lines BLm based on a column address received from the control logic 170.

The I/O input circuit 150 may be coupled to the controller 200 through an I/O line I/O and exchange a command, an address, and data with the controller 200.

The voltage supply circuit 160 may generate voltages to be used in an internal operation of the nonvolatile memory device 100. The voltages generated in the voltage supply circuit 160 may be applied to the memory cells of the memory cell array 110. For example, a program voltage generated in a program operation may be applied to word lines of memory cells on which the program operation is to be performed. In another example, an erase voltage generated in an erase operation may be applied to well regions of memory cells on which the erase operation is to be performed. In another example, a read voltage generated in a read operation may be applied to word lines of memory cells on which the read operation is to be performed.

The control logic 170 may control an overall operation of the nonvolatile memory device 100 related to the program (or write), read, and erase operations. For example, the control logic 170 may control the nonvolatile memory device 100 to perform the program operation and the read operation on the memory cell array 110 in response to a program command and a read command received from the controller 200.

The control logic 170 may further control the nonvolatile memory device 100 to perform an erase operation on the memory cell array 110 in response to an erase command received from the controller 200. The program operation and the read operation may be performed in page units and the erase operation may be performed in block units, but this is not limited thereto.

The control logic 170 may provide a row address for selecting a word line and a column address for selecting a bit line to the row decoder 120 and the column decoder 140 based on an address received from the controller 200.

Figure 3:
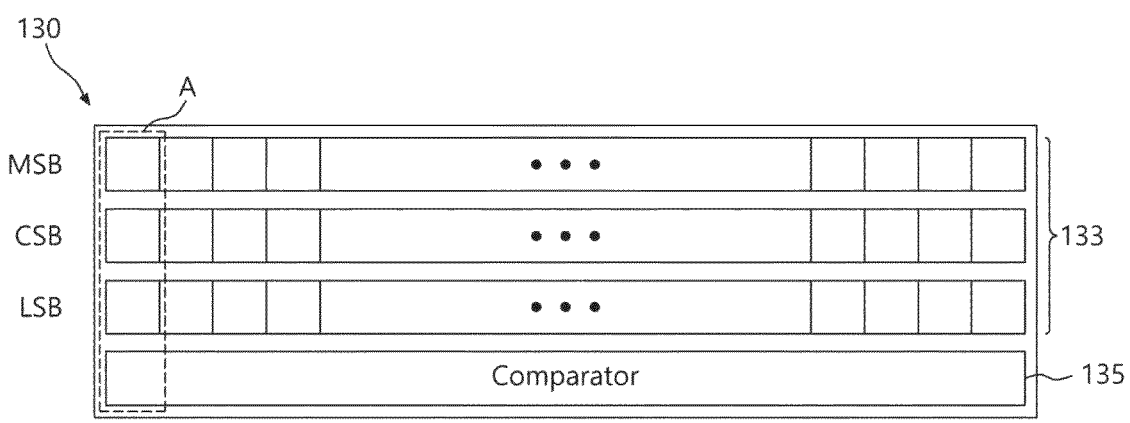
FIG. 3 is a block diagram illustrating a configuration example of a page buffer of FIG. 2.

FIG. 3 is a block diagram illustrating a configuration example of the page buffer 130 shown in FIG. 2. Referring to FIG. 3, the page buffer 130 may include a latch unit 133 and a comparator 135.

Program data and read data may be temporarily stored in the latch unit 133. For example, when the memory cells included in the memory cell array 110 are a TLC in which 3-bit data is stored, the latch unit 133 may include three latches, for example, first to third latches. For example, the first latch may be a least significant bit (LSB) latch configured to temporarily store LSB data. The second latch may be a central significant bit (CSB) latch configured to temporarily store CSB data. The third latch may be a most significant bit (MSB) latch configured to temporarily store MSB data.

Figure 4:
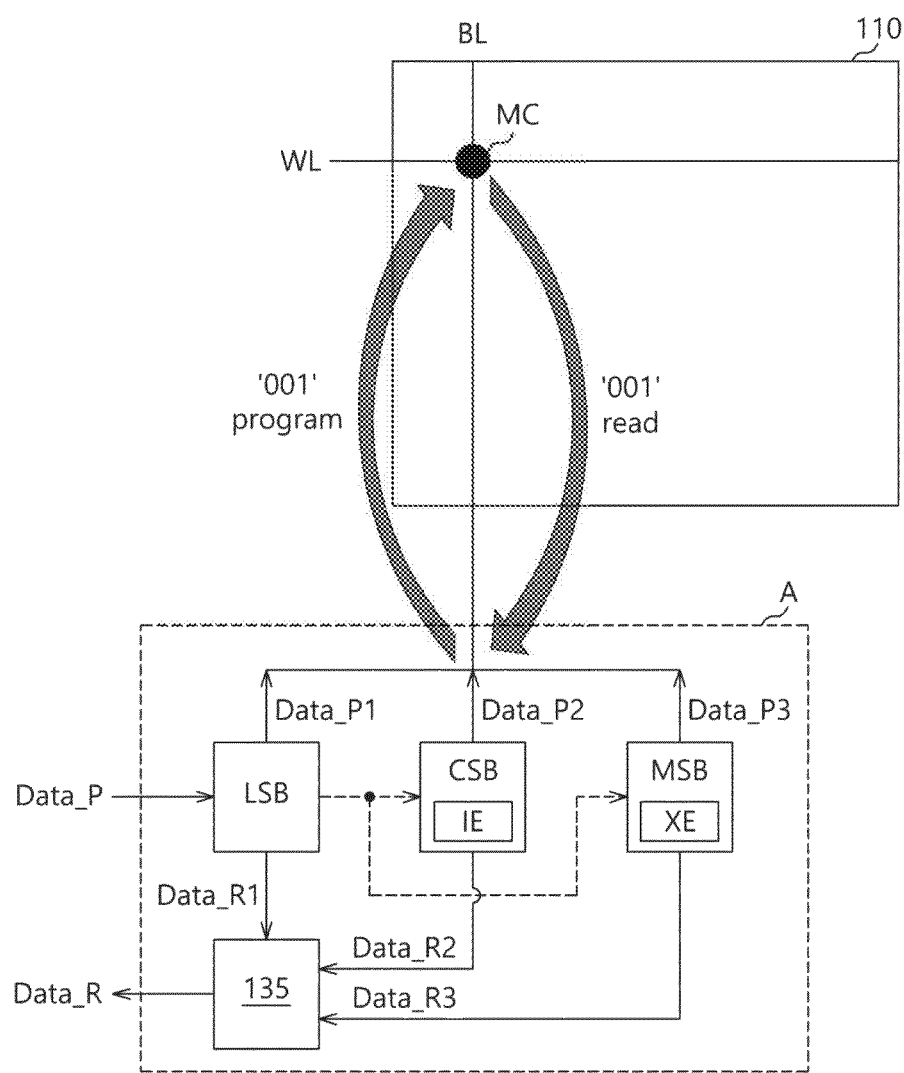
FIG. 4 is a detailed diagram illustrating a configuration example of a portion A of FIG. 3.

FIG. 4 is a detailed diagram illustrating a configuration example of a portion A of the page buffer 130 of FIG. 3. For clarity and example, the configuration of the page buffer 130 coupled to one memory cell MC is illustrated in FIG. 4, but the configuration of the corresponding page buffer may be equally applied to all the memory cells included in the memory cell array 110. For clarity and example, it may be assumed that data Data_P, Data_P1, Data_P2, Data_P3, Data_R, Data_R1, Data_R2, and Data_R3 are 1-bit data, but it is to be noted that the present embodiment is not limited thereto.

Figure 5:
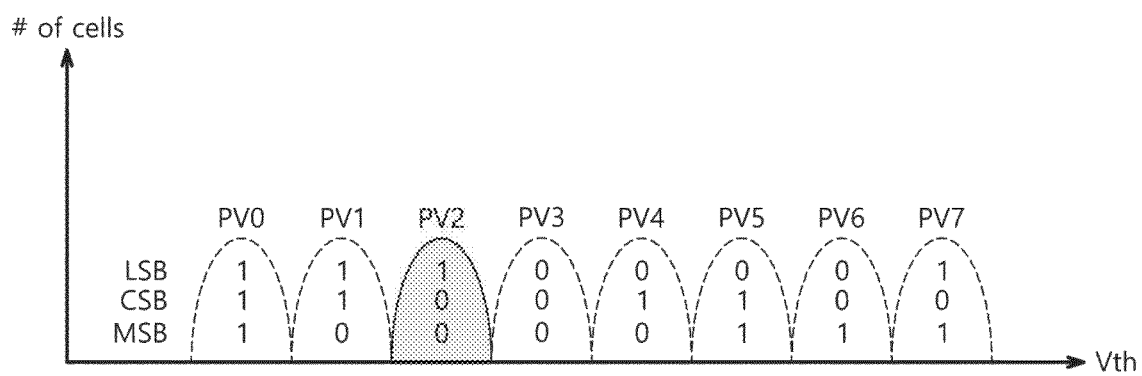
FIG. 5 is a diagram illustrating an example of a threshold voltage distribution in which a memory cell of FIG. 4 is included.

FIG. 5 is a diagram illustrating an example of a threshold voltage distribution in which a memory cell of FIG. 4 is included.

Referring to FIG. 4, program data Data_P provided from a host apparatus (not shown) may be stored as first program data Data_P1 in the LSB latch. For clarity, it may be assumed that the program data Data_P is '1'.

The LSB latch may provide the stored first program data Data_P1 to the CSB latch and the MSB latch. The first program data Data_P1 may be the same program data as the program data Data_P received from the host apparatus. Hereinafter, the program data stored in the LSB latch may refer to 'original program data'. Since the first program data Data_P1 stored in the LSB latch is the same as the program data Data_P provided from the host apparatus, the first program data Data_P1 may be '1'.

The CSB latch may include an inverting engine IE. The CSB latch may generate and store second program data Data_P2 by inverting the first program data Data_P1 provided from the LSB latch using the inverting engine IE. Hereinafter, the program data stored in the CSB latch may refer to 'inverted program data'. Since the second program data Data_P2 stored in the CSB latch is inverted data of the first program data Data_P1, the second program data Data_P2 may be '0'.

The MSB latch may include an XOR engine XE. The MSB latch may generate and store third program data Data_P3 by performing an XOR operation on the first program data Data_P1 provided from the LSB latch and a preset value using the XOR engine XE. The preset value may be set to an arbitrary value. For example, the preset value may be any one hexadecimal value selected from among '00h' to 'FFh'. Hereinafter, the program data stored in the MSB latch may refer to 'XOR-operated' program data. For example, when the preset value is 'FFh', the third program data Data_P3 stored in the MSB latch may be '0'.

The latch unit 133 of the page buffer 130 may convert one piece of program data for one page of a memory cell MC into three pieces of program data for three pages to store the conversion result. For example, the original program data may be stored in the LSB latch, the inverted program data may be stored in the CSB latch, and the XOR-operated program data may be stored in the MSB latch.

As described above, when the original program data has a value of '1', the inverted program data has a value of '0', and the XOR-operated program data has a value of '0', 3-bit data of '001' may be stored in the memory cell MC. The original program data stored in the LSB latch, the inverted program data stored in the CSB latch, and the XOR-inverted program data stored in the MSB latch may be programmed in the memory cell MC through a one-shot program method.

Referring to FIG. 5, the programmed memory cell MC may be included in the shadowed threshold voltage distribution. For example, the program data provided from the host apparatus may be 1-bit data of '1', but 3-bit data of '001' may be stored in the memory cell MC.

Referring back to FIG. 4, a plurality of data pieces may be read from the memory cell MC respectively into the LSB, CSB, and MSB latches of the latch unit 133 during a read operation. The CSB and LSB latches may perform the logical operations (i.e., the inversion and XOR operations) to the provided pieces of data, respectively. Thus, the LSB, CSB, and MSB latches may store a plurality of pieces of read data Data_R1, Data_R2, and Data_R3, respectively. The comparator 135 of the page buffer 130 may compare a plurality of pieces of read data Data_R1, Data_R2, and Data_R3 provided from the LSB latch, the CSB latch, and the MSB latch of the latch unit 133 and when 'n' or more pieces of read data are identical to one another among the pieces of read data Data_R1, Data_R2, and Data_R3, the comparator 135 may output any one among 'n' or more pieces of identical read data as the original read data Data_R. In the present embodiment, 'n' may be two, but it is not limited thereto.

For example, when a read request for a memory cell MC is received from a host apparatus, 3-bit data of '001' may be read out from the memory cell MC. The 3-bit read data, for example, '001' may be stored in the MSB latch, the CSB latch, and the LSB latch of the page buffer 130 by one bit as the MSB data, the CSB data, and the LSB data.

The LSB latch may provide the LSB data (for example, '1') stored therein to the comparator 135 as the first piece of read data Data_R1. The CSB latch may invert the CSB data (for example, '0') stored therein using the inverting engine IE and provide the inverted CSB data (for example, '1') to the comparator 135 as the second piece of read data Data_R2. The MSB latch may perform an XOR operation on the MSB data (for example, '0') stored therein and a preset value (for example, 'FFh') using the XOR engine XE and provide the XOR-operated MSB data (for example, '1') to the comparator 135 as the third piece of read data Data_R3. All the first piece of read data Data_R1, the second piece of read data Data_R2, and the third piece of read data Data_R3 provided from the LSB latch, the CSB latch, and the MSB latch may be the same as each other, for example, may be '1'.

The comparator 135 may compare the first piece of read data Data_R1, the second piece of read data Data_R2, and the third piece of read data Data_R3. Since three pieces of read data Data_R1, Data_R2, and data Data_R3 are identical with each other, the comparator 135 may output 1-bit data of '1' as the original read data Dara_R. The original read data Data_R output from the comparator 135 may be transmitted to the controller 200 through the I/O circuit 150.

For example, in the embodiment, the single level program data received from a host apparatus may be converted into the multi-level program data and may be programmed in the memory cell. The multi-level read data read out from the memory cell may be converted into the single level read data and may be transmitted to the host apparatus. The 'single level data' may be program data for one page of the memory cell and the 'multi-level data' may be a plurality of pieces of program data for a plurality of pages of the memory cell.

In accordance with an embodiment of the present disclosure, the program command received from the controller 200 may include a normal program command and a multi-conversion program command and the read command received from the controller 200 may include a normal read command and a single conversion read command.

The normal program command and the normal read command may be a general program command and a general read command widely used in the related art. For example, the normal program command may be a program command for storing the single level program data received from the host apparatus in one page of the memory cell or storing the multi-level program data received from the host apparatus in a plurality of pages of the memory cell. The normal read command may be a read command for providing, to the host apparatus, the signal level read data read out from one page of the memory cell or the multi-level read data read out from a plurality of pages of the memory cell.

The multi-conversion program command may be a program command for converting the single level program data received from a host apparatus to the multi-level program data and storing the converted multi-level program data in a plurality of pages of the memory cell. The single conversion read command may be a read command for providing to the host apparatus one piece of read data among multi-level read data read out from a plurality of pages of the memory cell.

For example, when the multi-conversion program command and the single level program data are provided from the controller 200, the control logic 170 may control the page buffer 130 to store the same program data as the provided single level program data in the LSB latch, to store program data to which the single level program data is inverted in the CSB latch, and to store XOR-operated program data of the single level program data and a preset value in the MSB latch.

When the single conversion read command is provided from the controller 200, the control logic 170 may control the nonvolatile memory device 100 to read out pieces of data from a plurality of pages of a corresponding memory cell. The pieces of data read out from the pages may be stored in the LSB latch, the CSB latch, and the MSB latch of the page buffer 130 by one bit. The control logic 170 may control the page buffer 130 to provide a first piece of the read data stored in the LSB latch as an original value to the comparator 135, to provide a second piece of the read data stored in the CSB latch as an inverted value to the comparator 135, and to provide a third piece of the read data stored in the MSB latch as a value XOR-operated with the preset value to the comparator 135. When two or more have the same value as one another among the pieces of the read data as a comparison result by the comparator 135, the control logic 170 may control the page buffer 130 to output the piece of the read data having the same value as the original read data.

As described above with reference to FIG. 2, the control logic 170 may control the nonvolatile memory device 100 to perform an erase operation on the memory cell array 110 in response to an erase command received from the controller 200. The program operation and the read operation may be performed in page units and the erase operation may be performed in block units, but this is not limited thereto.

The control logic 170 may provide a row address for selecting a word line and a column address for selecting a bit line to the row decoder 120 and the column decoder 140 based on an address received from the controller 200.

Figure 6:
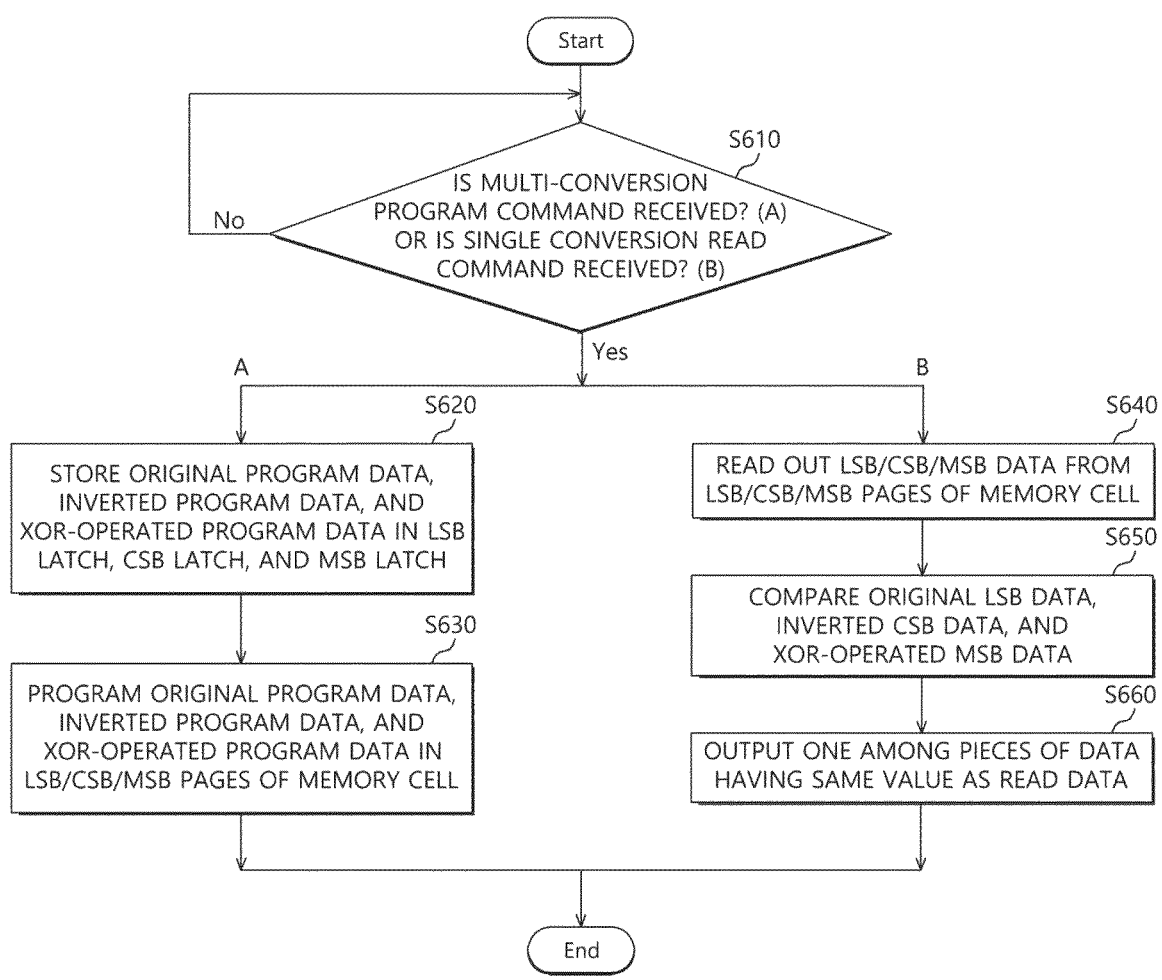
FIG. 6 is a flowchart illustrating an operating method of a nonvolatile memory device according to an embodiment of the present disclosure.

FIG. 6 is a flowchart illustrating an operating method of the nonvolatile memory device 100 according to an embodiment. The operating method of the nonvolatile memory device 100 according to an embodiment will be described with reference to FIGS. 1 to 5.

In operation S610, the control logic 170 of the nonvolatile memory device 100 may determine whether a multi-conversion program command or a single conversion read command is received from the controller 200.

When the multi-conversion program command is received from the controller 200 ("A" in operation S610), the control logic 170 may proceed to operation S620.

In operation S620, the control logic 170 may control the page buffer 130 to store original program data in the LSB latch of the page buffer 130, to store inverted program data in the CSB latch, and to store XOR-operated program data in the MSB latch based on program data (e.g., Data_P of FIG. 4) received with the multi-conversion program command from the controller 200. Since detailed descriptions have been made above, overlapping descriptions will be omitted here.

In operation S630, the control logic 170 may control the nonvolatile memory device 100 to store the original program data, the inverted program data, and the XOR-operated program data stored in the LSB latch, the CSB latch, and the MSB latch of the page buffer 130 in a memory cell MC corresponding to a program address provided from the controller 200. The original program data, the inverted program data, and the XOR-operated program data may be stored in the LSB page, the CSB page, and the MSB page of the memory cell MC through a one-shot program method.

When the command received from the controller 200 is the single conversion read command ("B" In operation S610), the control logic 170 may proceed to operation S640.

In operation S640, the control logic 170 may control the nonvolatile memory device 100 to read out pieces of data stored in the pages (for example, the LSB data, the CSB data, and the MSB data stored in the LSB page, the CSB page, and the MSB page) of a memory cell (MC) corresponding to a read address provided from the controller 200. The LSB data, the CSB data, and the MSB data stored in the LSB page, the CSB page, and the MSB page of the memory cell MC may be read out through a one-shot read method. The LSB data, the CSB data, and the MSB data stored in the memory cell MC may be the original program data, the inverted program data, and the XOR-operated program data which are programmed in operation S630. The LSB data, the CSB data, and the MSB data read out from the memory cell MC may be stored in the LSB latch, the CSB latch, and the MSB latch of the page buffer 130. The CSB and LSB latches may perform the logical operations (i.e., the inversion and XOR operations) to the provided pieces of data, respectively. Thus, the LSB, CSB, and MSB latches may store the LSB data, the inverted CSB data and XOR-operated MSB data, respectively.

In operation S650, the control logic 170 may control the page buffer 130 to compare the original LSB data, the inverted CSB data, and the XOR-operated MSB data. For example, the LSB data stored in the LSB latch may be provided to the comparator 135, the inverted CSB data stored in the CSB latch may be provided to the comparator 135, and the XOR-operated MSB data stored in the MSB latch may be provided to the comparator 135. The comparator 135 may determine whether or not two or more have the same value as each other among the LSB data, the inverted CSB data, and the XOR-operated MSB data.

In operation S660, the control logic 170 may control the page buffer 130 to output any one of the two or more having the same value as the read data as a comparison result. For example, when two or more have the same value among the original LSB data, the inverted CSB data, and the XOR-operated LSB data, the control logic 170 may control the page buffer 130 to output any one of the two or more having the same value among the original LSB data, the inverted CSB data, and the XOR-operated LSB data as the read data to the controller 200 through the comparator 135.

Figure 7:
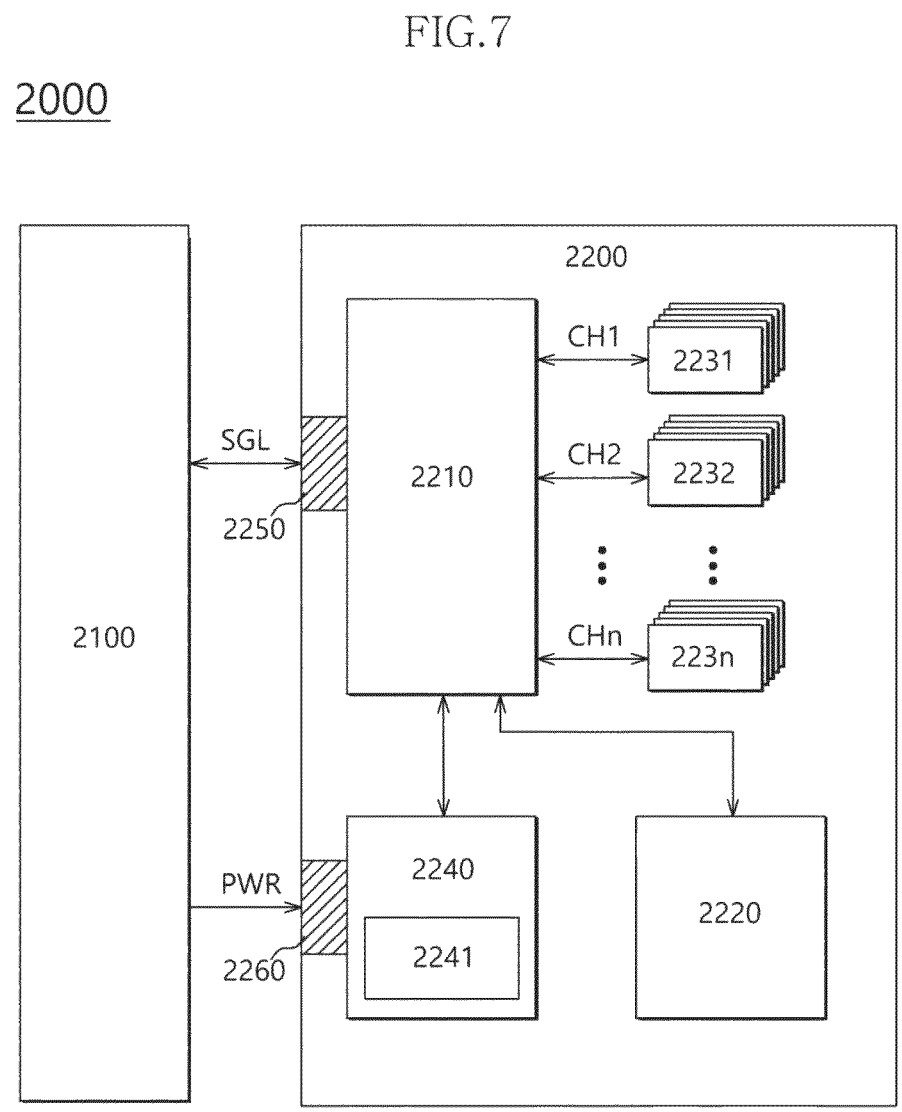
FIG. 7 is a diagram illustrating an example of a data processing system including a solid state drive (SSD) according to an embodiment of the present disclosure.

FIG. 7 is a diagram illustrating an application example of a data processing system including a solid state drive (SSD) according to an embodiment. Referring to FIG. 7, a data processing system 2000 may include a host apparatus 2100 and a SSD 2200.

The SSD 2200 may include a controller 2210, a buffer memory device 2220, nonvolatile memory devices 2231 to 223n, a power supply 2240, a signal connector 2250, and a power connector 2260.

The controller 2210 may control an overall operation of the SSD 2220.

The buffer memory device 2220 may temporarily store data to be stored in the nonvolatile memory devices 2231 to 223n. The buffer memory device 2220 may temporarily store data read from the nonvolatile memory devices 2231 to 223n. The data temporarily stored in the buffer memory device 2220 may be transmitted to the host apparatus 2100 or the nonvolatile memory devices 2231 to 223n according to control of the controller 2210.

The nonvolatile memory devices 2231 to 223n may be used as a storage medium of the SSD 2200. The nonvolatile memory devices 2231 to 223n may be coupled to the controller 2210 through a plurality of channels CH1 to CHn. One or more nonvolatile memory devices may be coupled to one channel. The nonvolatile memory devices coupled to the one channel may be coupled to the same signal bus and the same data bus.

The power supply 2240 may provide power PWR input through the power connector 2260 to the inside of the SSD 2200. The power supply 2240 may include an auxiliary power supply 2241. The auxiliary power supply 2241 may supply the power so that the SSD 2200 is normally terminated even when sudden power-off occurs. The auxiliary power supply 2241 may include large capacity capacitors capable of charging the power PWR.

The controller 2210 may exchange a signal SGL with the host apparatus 2100 through the signal connector 2250. The signal SGL may include a command, an address, data, and the like. The signal connector 2250 may be configured of various types of connectors according to an interfacing method between the host apparatus 2100 and the SSD 2200.

Figure 8:
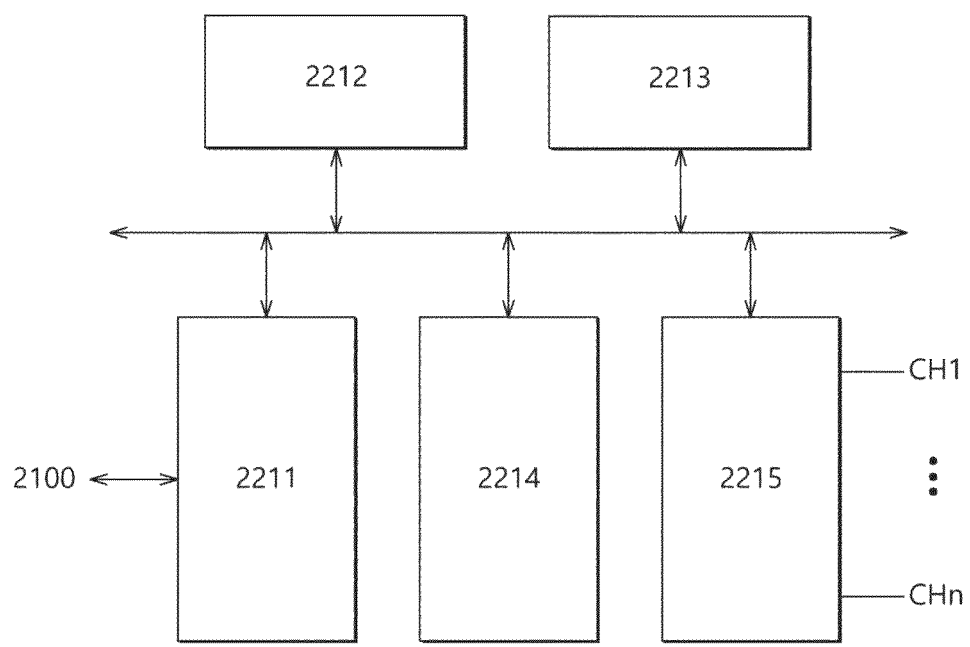
FIG. 8 is a diagram illustrating an example of a controller illustrated in FIG. 7.

FIG. 8 is a diagram illustrating an example of the controller 2210 of FIG. 7. Referring to FIG. 8, the controller 2210 may include a host interface unit 2211, a control unit 2212, a random access memory (RAM) 2213, an error correction code (ECC) unit 2214, and a memory interface unit 2215. The controller 2210 may correspond to the controller 200 described above.

The host interface unit 2211 may perform interfacing between the host apparatus 2100 and the SSD 2200 according to a protocol of the host apparatus 2100. For example, the host interface unit 2211 may communicate with the host apparatus 2100 through any one among a secure digital protocol, a universal serial bus (USB) protocol, a multimedia card (MMC) protocol, an embedded MMC (eMMC) protocol, a personal computer memory card international association (PCMCIA) protocol, a parallel advanced technology attachment (PATA) protocol, a serial advanced technology attachment (SATA) protocol, a small computer system interface (SCSI) protocol, a serial attached SCSI (SAS) protocol, a peripheral component interconnection (PCI) protocol, a PCI Express (PCI-E) protocol, and a universal flash storage (UFS) protocol. The host interface unit 2211 may perform a disc emulation function that the host apparatus 2100 recognizes the SSD 2200 as a general-purpose data storage apparatus, for example, a hard disc drive HDD.

The control unit 2212 may analyze and process the signal SGL input from the host apparatus 2100. The control unit 2212 may control operations of internal functional blocks according to firmware and/or software for driving the SDD 2200. The RAM 2213 may be operated as a working memory for driving the firmware or software.

The ECC unit 2214 may generate parity data for the data to be transferred to the nonvolatile memory devices 2231 to 223n. The generated parity data may be stored in the nonvolatile memory devices 2231 to 223n together with the data. The ECC unit 2214 may detect errors for data read from the nonvolatile memory devices 2231 to 223n based on the parity data. When detected errors are within a correctable range, the ECC unit 2214 may correct the detected errors.

The memory interface unit 2215 may provide a control signal such as a command and an address to the nonvolatile memory devices 2231 to 223n according to control of the control unit 2212. The memory interface unit 2215 may exchange data with the nonvolatile memory devices 2231 to 223n according to control of the control unit 2212. For example, the memory interface unit 2215 may provide data stored in the buffer memory device 2220 to the nonvolatile memory devices 2231 to 223n or provide data read from the nonvolatile memory devices 2231 to 223n to the buffer memory device 2220.

Figure 9:
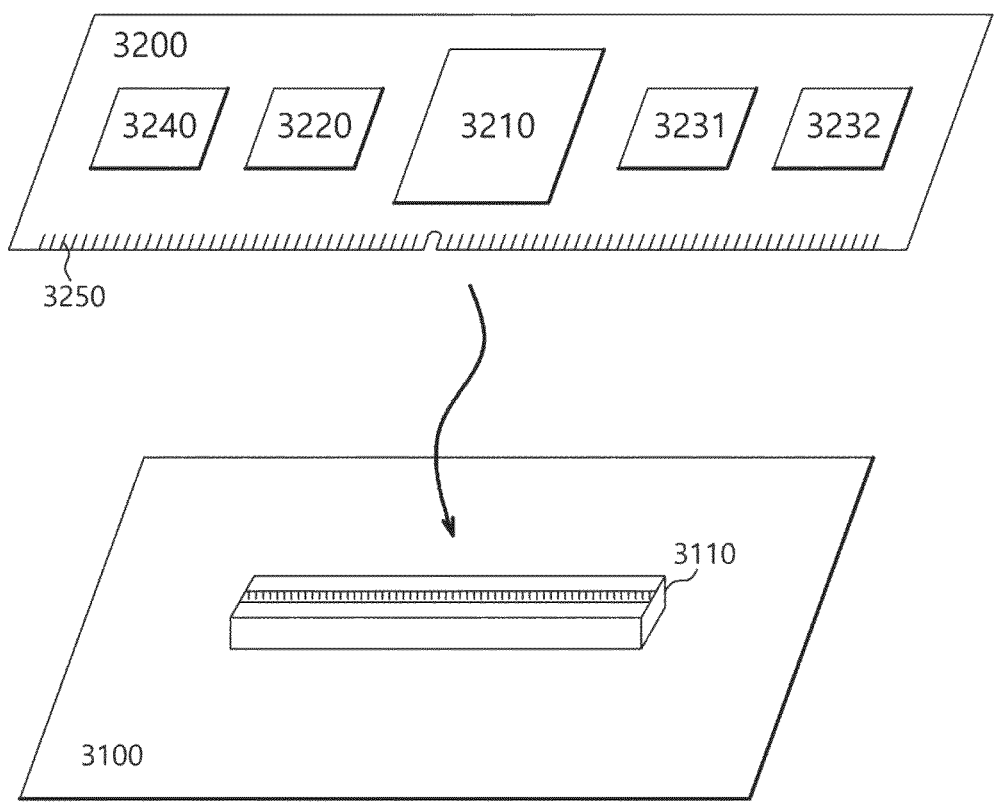
FIG. 9 is a diagram illustrating an example of a data processing system including a data storage apparatus according to an embodiment of the present disclosure.

FIG. 9 is a diagram illustrating an application example of a data processing system including a data storage apparatus according to an embodiment. Referring to FIG. 9, a data processing system 3000 may include a host apparatus 3100 and a data storage apparatus 3200. The data storage apparatus 3200 may correspond to the data storage apparatus 10 of FIG. 1.

The host apparatus 3100 may be configured in a board form such as a printed circuit board (PCB). Although not shown in FIG. 9, the host apparatus 3100 may include internal functional blocks configured to perform functions of the host apparatus 3100.

The host apparatus 3100 may include a connection terminal 3110 such as a socket, a slot, or a connector. The data storage apparatus 3200 may be mounted on the connection terminal 3110.

The data storage apparatus 3200 may be configured in a board form such as a PCB. The data storage apparatus 3200 may refer to a memory module or a memory card. The data storage apparatus 3200 may include a controller 3210, a buffer memory device 3220, nonvolatile memory devices 3231 to 3232, a power management integrated circuit (PMIC) 3240, and a connection terminal 3250.

The controller 3210 may control an overall operation of the data storage apparatus 3200. The controller 3210 may be configured to have the same configuration as the controller 2210 illustrated in FIG. 8.

The buffer memory device 3220 may temporarily store data to be stored in the nonvolatile memory devices 3231 and 3232. The buffer memory device 3220 may temporarily store data read from the nonvolatile memory devices 3231 and 3232. The data temporarily stored in the buffer memory device 3220 may be transmitted to the host apparatus 3100 or the nonvolatile memory devices 3231 and 3232 according to control of the controller 3210.

The nonvolatile memory devices 3231 and 3232 may be used as a storage medium of the data storage apparatus 3200.

The PMIC 3240 may provide power input through the connection terminal 3250 to the inside of the data storage apparatus 3200. The PMIC 3240 may manage the power of the data storage apparatus 3200 according to control of the controller 3210.

The connection terminal 3250 may be coupled to the connection terminal 3110 of the host apparatus 3100. A signal such as a command, an address, and data and power may be transmitted between the host apparatus 3100 and the data storage apparatus 3200 through the connection terminal 3250. The connection terminal 3250 may be configured in various forms according to an interfacing method between the host apparatus 3100 and the data storage apparatus 3200. The connection terminal 3250 may be arranged in any one side of the data storage apparatus 3200.

Figure 10:
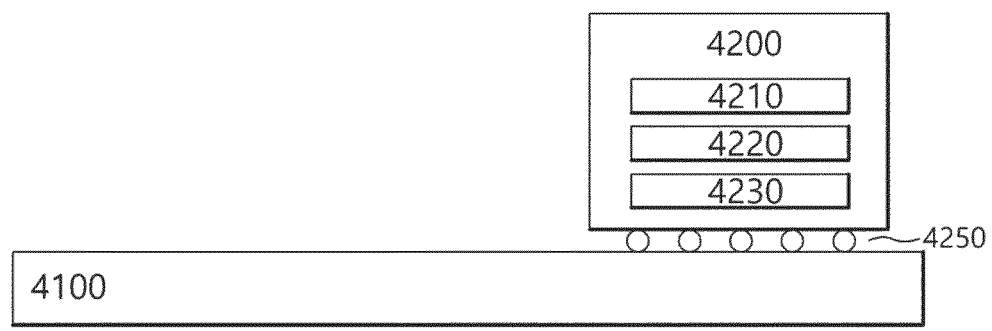
FIG. 10 is a diagram illustrating an example of a data processing system including a data storage apparatus according to an embodiment of the present disclosure.

FIG. 10 is a diagram illustrating an application example of a data processing system including a data storage apparatus according to an embodiment. Referring to FIG. 10, a data processing system 4000 may include a host apparatus 4100 and a data storage apparatus 4200. The data storage apparatus 4200 may correspond to the data storage apparatus 10 of FIG. 1.

The host apparatus 4100 may be configured in a board form such as a PCB. Although not shown in FIG. 10, the host apparatus 4100 may include internal functional blocks configured to perform functions of the host apparatus 4100.

The data storage apparatus 4200 may be configured in a surface mounting packaging form. The data storage apparatus 4200 may be mounted on the host apparatus 4100 through a solder ball 4250. The data storage apparatus 4200 may include a controller 4210, a buffer memory device 4220, and a nonvolatile memory device 4230.

The controller 4210 may control an overall operation of the data storage apparatus 4200. The controller 4210 may be configured to have the same configuration as the controller 2210 illustrated in FIG. 8.

The buffer memory device 4220 may temporarily store data to be stored in the nonvolatile memory device 4230. The buffer memory device 4220 may temporarily store data read from the nonvolatile memory device 4230. The data temporarily stored in the buffer memory device 4220 may be transmitted to the host apparatus 4100 or the nonvolatile memory device 4230 through control of the controller 4210.

The nonvolatile memory device 4230 may be used as a storage medium of the data storage apparatus 4200.

Figure 11:
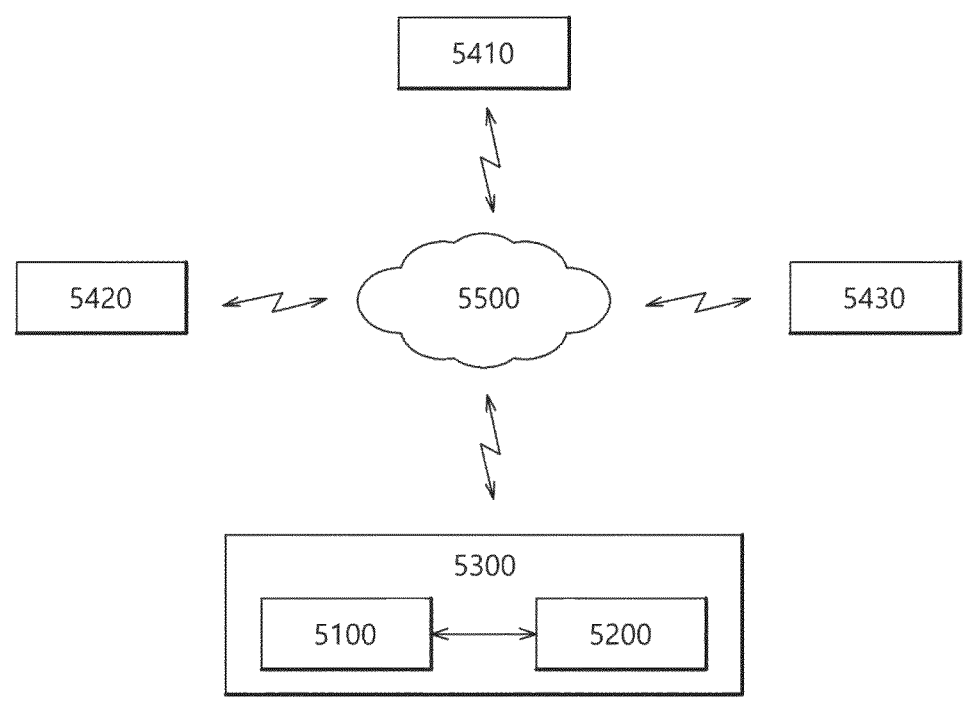
FIG. 11 is a diagram illustrating an example of a network system including a data storage apparatus according to an embodiment of the present disclosure.

FIG. 11 is a diagram illustrating an example of a network system 5000 including a data storage apparatus according to an embodiment. Referring to FIG. 11, the network system 5000 may include a server system 5300 and a plurality of client systems 5410 to 5430 which are coupled through a network 5500.

The server system 5300 may serve data in response to requests of the plurality of client systems 5410 to 5430. For example, the server system 5300 may store data provided from the plurality of client systems 5410 to 5430. In another example, the server system 5300 may provide data to the plurality of client systems 5410 to 5430.

The server system 5300 may include a host apparatus 5100 and a data storage apparatus 5200. The data storage apparatus 5200 may be configured of the data storage apparatus 10 of FIG. 1, the data storage apparatus 2200 of FIG. 7, the data storage apparatus 3200 of FIG. 9, or the data storage apparatus 4200 of FIG. 10.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A nonvolatile memory device comprising:
 a memory cell array;
 a page buffer including a first latch configured to store data to be programmed in a first state, a second latch configured to store the data in a second state, and a third latch configured to store the data in a third state when the data is received from an external apparatus; and
 a control logic configured to control the page buffer to store the data of the first state in the first latch, the data of the second state in the second latch, and the data of the third state in the third latch when a multi-conversion program command and the data are received from the external apparatus,
 wherein the first state is the same state as the state of the data, the second state is an inverted state of the data, and the third state is an XOR-operated state of the data and a preset value.

2. The nonvolatile memory device of claim 1, wherein the first latch provides the data of the first state to the second latch and the third latch.

3. The nonvolatile memory device of claim 1,
 wherein the second latch includes an inverting engine configured to invert the data, and
 wherein the second latch generates and stores the data of the second state by inverting the data of the first state using the inverting engine.

4. The nonvolatile memory device of claim 1,
 wherein the third latch includes an XOR engine configured to perform an XOR operation on the data and the preset value, and
 wherein the third latch generates and stores the data of the third state by performing an XOR operation on the data of the first state and the preset value using the XOR engine.

5. The nonvolatile memory device of claim 1,
 wherein the memory cell array includes a plurality of memory cells and each of the memory cells includes a plurality of pages, and
 wherein the control logic controls the nonvolatile memory device to store the data of the first state in the first latch, the data of the second state in the second latch, and the data of the third state in the third latch of the page buffer in pages of a memory cell corresponding to an address to be programmed.

6. The nonvolatile memory device of claim 5, wherein when a single conversion read command is received from the external apparatus, the control logic controls the nonvolatile memory device to read out the data of the first state, the data of the second state, and the data of the third state from a plurality of pages of a memory cell corresponding to an address to be read, and controls the page buffer to output one piece of data selected from among the read data of the first state, the read data of the second state, and the read data of the third state as read data.

7. The nonvolatile memory device of claim 6, wherein the data of the first state, the data of the second state, and the data of the third state read out from the plurality of pages are stored in the first latch, the second latch, and the third latch of the page buffer.

8. The nonvolatile memory device of claim 7,
 wherein the page buffer further includes a comparator configured to compare the pieces of data read out from the plurality of pages of the memory cell and output one of piece of data having the same value as the read data when the number of pieces of data having the same value is n or more, wherein n is two or more, wherein the first latch provides the data of the first state to the comparator as the data of the first state, wherein the second latch inverts the data of the second state and provides inverted data to the comparator, and wherein the third latch performs an XOR operation on the data of the third state and a preset value and provides XOR-operated data to the comparator.

9. The nonvolatile memory device of claim 1, wherein the data stored in the first latch, the data stored in the second latch, and the data stored in the third latch is programmed in the memory cell array using a one-shot program method.

10. The nonvolatile memory device of claim 1, wherein the first latch is a least significant bit (LSB) latch, the second latch is a central significant bit (CSB) latch, and the third latch is a most significant bit (MSB) latch.

11. An operating method of a nonvolatile memory device, the method comprising:

determining whether a multi-conversion program command is received from an external apparatus;

storing data of a first state in a first latch, data of a second state in a second latch, and data of a third state in a third latch of a page buffer based on data to be programmed received with the multi-conversion program command when the multi-conversion program command is received; and storing the data of the first state, the data of the second state, and the data of the third state stored in the page buffer in pages of a memory cell corresponding to an address to be programmed, wherein the data of the first state is the same data as the data to be programmed, the data of the second state is inverted data of the data to be programmed, and the data of the third state is XOR-operated data of the data to be programmed and a preset value.

12. The method of claim 11, wherein the storing of the data of the first state in the first latch, the data of the second state in the second latch, and the data of the third state in the third latch of the page buffer includes:

providing the data of the first state to the second latch and the third latch from the first latch;

generating and storing the data of the second state by inverting the data of the first state in the second latch; and generating and storing the data of the third state by performing an XOR operation on the data of the first state and the preset value in the third latch.

13. The method of claim 11, wherein the determining of whether the multi-conversion program command is received further includes determining whether a single conversion read command is received.

14. The method of claim 13, further comprising when the single conversion read command is received:

reading out data of the first state, the data of the second state, and the data of the third state from the pages of the memory cell;

determining whether pieces of data having the same value among the data of the first state, inverted data of the data of the second state, and XOR-operated data of the data of the third state and the preset value are present by comparing the data of the first state, the inverted data, and the XOR-operated data; and outputting one piece of data among the pieces of data having the same value as read data when the pieces of data having the same value are present.

15. A data storage apparatus comprising:

a nonvolatile memory device; and a controller configured to control an operation of the nonvolatile memory device, wherein the nonvolatile memory device includes:

a memory cell array including a plurality of memory cells, each memory cell configured of a plurality of pages;

a page buffer including a first latch configured to store data to be programmed in an original state, a second latch configured to store the data in an inverted state, and a third latch configured to store the data in a state XOR-operated with a preset value when the data is received from the controller; and a control logic configured to control the nonvolatile memory device to store the data of the original state, the data of the inverted state, and the data of the XOR-operated state in pages of a memory cell corresponding to an address to be programmed when a multi-conversion program command is received from the controller.

16. The data storage apparatus of claim 15, wherein when a single conversion read command is received from the controller, the control logic controls the nonvolatile memory device to read out the data of the original state, the data of the inverted state, and the data of the XOR-operated state from a plurality of pages of a memory cell corresponding to an address to be read and controls the page buffer to output one piece of data among the data of the original state, the data of the inverted state, and the data of the XOR-operated state as read data.

17. The data storage apparatus of claim 16, wherein the page buffer further includes a comparator configured to compare the data of the original state, the data of the inverted state, and the data of the XOR-operated state, and wherein the data of the original state is provided to the comparator as the data of the original state, wherein the data of the inverted state is inverted again and provided to the comparator, and wherein the data of the XOR-operated state is XOR-operated with the preset value again and provided to the comparator.

* * * * *